US011271044B2

(12) United States Patent
Horiuchi et al.

(10) Patent No.: US 11,271,044 B2
(45) Date of Patent: Mar. 8, 2022

(54) ORGANIC PHOTOELECTRIC CONVERSION DEVICE, AND METHOD FOR MANUFACTURING ORGANIC PHOTOELECTRIC CONVERSION DEVICE

(71) Applicant: HAMAMATSU PHOTONICS K.K., Hamamatsu (JP)

(72) Inventors: Yasuyuki Horiuchi, Hamamatsu (JP); Hiroyuki Sugiyama, Hamamatsu (JP); Masato Kitabayashi, Hamamatsu (JP); Naoki Umebayashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/970,403

(22) PCT Filed: Jan. 31, 2019

(86) PCT No.: PCT/JP2019/003513
§ 371 (c)(1),
(2) Date: Aug. 17, 2020

(87) PCT Pub. No.: WO2019/159708
PCT Pub. Date: Aug. 22, 2019

(65) Prior Publication Data
US 2021/0118953 A1 Apr. 22, 2021

(30) Foreign Application Priority Data
Feb. 19, 2018 (JP) .............................. JP2018-027280

(51) Int. Cl.
*H01L 27/30* (2006.01)
*H01L 51/42* (2006.01)
*H01L 51/44* (2006.01)

(52) U.S. Cl.
CPC ........ *H01L 27/302* (2013.01); *H01L 51/4253* (2013.01); *H01L 51/442* (2013.01); *H01L 51/447* (2013.01)

(58) Field of Classification Search
CPC . H01L 27/302; H01L 51/4253; H01L 51/442; H01L 51/447; H01L 51/42; H01L 31/10; Y02P 70/50; Y02E 10/549
See application file for complete search history.

(56) References Cited

U.S. PATENT DOCUMENTS

2006/0180197 A1    8/2006  Gui et al.
2007/0012955 A1*   1/2007  Ihama ................ H01L 51/448
                                                    257/233
(Continued)

FOREIGN PATENT DOCUMENTS

JP    2005-347386 A    12/2005
JP    2008-509558 A     3/2008
(Continued)

OTHER PUBLICATIONS

JP-2011198856-A, Machine Translation (Year: 2011).*
(Continued)

*Primary Examiner* — Devina Pillay
(74) *Attorney, Agent, or Firm* — Faegre Drinker Biddle & Reath LLP

(57) ABSTRACT

An organic photoelectric conversion device includes first and second organic photoelectric conversion elements which convert light into electrical energy. The first and second organic photoelectric conversion elements are disposed to be stacked in this order along an incident direction of the light. The first organic photoelectric conversion element includes a first element main body including a first substrate, first and second transparent electrodes, and an organic photoelectric conversion unit having sensitivity in a first wavelength band of the light, and a first protective film that covers the first element main body. The second organic photoelectric conversion element includes a second element main body including a second substrate, a third transparent electrode, an electrode, and an organic photoelectric conversion unit having sensitivity in a second wavelength band of the light, and a second protective film that covers the second element main body.

8 Claims, 6 Drawing Sheets

(56) References Cited

U.S. PATENT DOCUMENTS

| | | | |
|---|---|---|---|
| 2008/0099068 A1* | 5/2008 | Forrest | B82Y 10/00 |
| | | | 136/263 |
| 2009/0159123 A1* | 6/2009 | Kothari | H01L 31/02167 |
| | | | 136/256 |
| 2009/0189515 A1 | 7/2009 | Halls et al. | |
| 2011/0036406 A1* | 2/2011 | Okubo | B82Y 10/00 |
| | | | 136/263 |
| 2012/0193689 A1 | 8/2012 | Park et al. | |

FOREIGN PATENT DOCUMENTS

| | | | |
|---|---|---|---|
| JP | 2010-073730 A | | 4/2010 |
| JP | 2010-080845 A | | 4/2010 |
| JP | 2010073730 A | * | 4/2010 |
| JP | 2011-009347 A | | 1/2011 |
| JP | 2011-198856 A | | 10/2011 |
| JP | 2011198856 A | * | 10/2011 |
| JP | 2012-129276 A | | 7/2012 |
| JP | 2015-531551 A | | 11/2015 |
| WO | WO-2006/017403 A2 | | 2/2006 |
| WO | WO-2012/035853 A1 | | 3/2012 |
| WO | WO-2014/059217 A1 | | 4/2014 |
| WO | WO-2018/020902 A1 | | 2/2018 |

OTHER PUBLICATIONS

JP-2010073730-A, Machine Translation (Year: 2010).*
International Preliminary Report on Patentability dated Sep. 3, 2020 for PCT/JP2019/003513.

* cited by examiner (a)

(b)

(a)

(b)

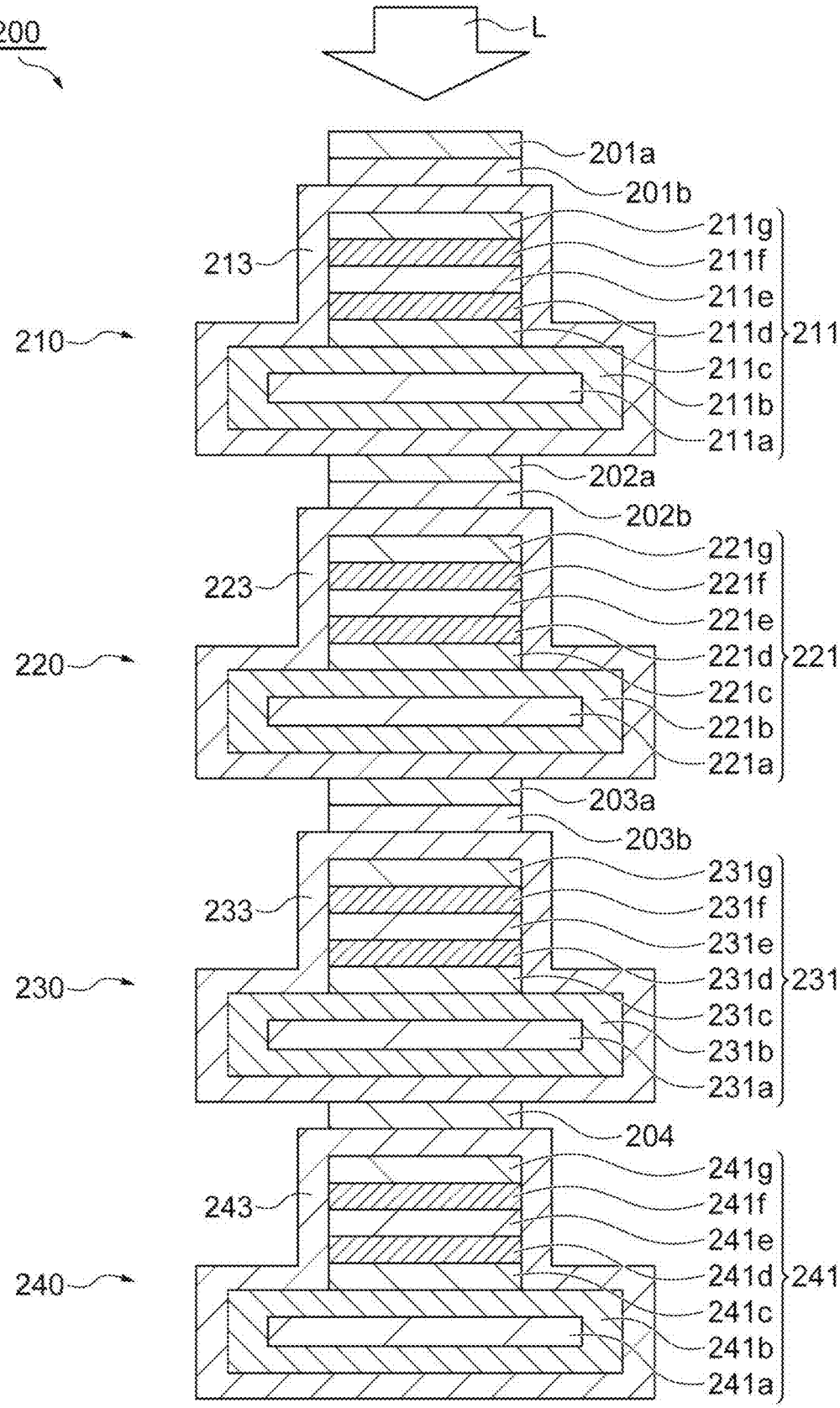

ORGANIC PHOTOELECTRIC CONVERSION DEVICE, AND METHOD FOR MANUFACTURING ORGANIC PHOTOELECTRIC CONVERSION DEVICE

TECHNICAL FIELD

As aspect of the invention relates to an organic photoelectric conversion device, and a method for manufacturing an organic photoelectric conversion device.

BACKGROUND ART

As a technology relating to an organic photoelectric conversion device in the related art, for example, Patent Literature 1 described below discloses a stacked organic photosensitive device including a first electrode, a second electrode, a first organic photoactive region disposed between the first electrode and the second electrode, and a second organic photoactive region disposed between the first electrode and the second electrode. In the stacked organic photosensitive device described in Patent Literature 1, the first organic photoactive region and the second organic photoactive region have absorption characteristics different from each other.

CITATION LIST

Patent Literature

Patent Literature 1: Japanese Unexamined Patent Publication No. 2008-509558

SUMMARY OF INVENTION

Technical Problem

In the organic photoelectric conversion device as described above, an organic photoelectric conversion unit that measures light by dividing the light for every different wavelength band, and is weak for oxygen or water vapor is used, and thus it is demanded to protect the organic photoelectric conversion unit from gases such as the air. In addition to the demand, for example, simplification of manufacturing is also required so as to enhance flexible production adaptability.

Here, an object of aspects of the invention is to provide an organic photoelectric conversion device and a method for manufacturing an organic photoelectric conversion device which are capable of realizing measurement of light by dividing the light for every different wavelength band, and are capable of realizing simplification of manufacturing while protecting an organic photoelectric conversion unit.

Solution to Problem

According to an aspect of the invention, there is provided an organic photoelectric conversion device including first and second organic photoelectric conversion elements which convert light into electrical energy. The first and second organic photoelectric conversion elements are disposed to be stacked in this order along an incident direction of the light. The first organic photoelectric conversion element includes a first element main body including a first substrate, first and second transparent electrodes, and an organic photoelectric conversion unit having sensitivity in a first wavelength band of the light, and a first protective film that covers the first element main body. The second organic photoelectric conversion element includes a second element main body including a second substrate, a third transparent electrode, an electrode, and an organic photoelectric conversion unit having sensitivity in a second wavelength band of the light, and a second protective film that covers the second element main body.

In the organic photoelectric conversion device, the first and second organic photoelectric conversion elements are disposed to be stacked in this order along the incident direction of light, and the light is measured in a state of being divided for every different wavelength band. According to this stacked structure, the need for optical axis adjustment can be eliminated. The first and second organic photoelectric conversion elements can be individually modulated, and thus it is easy to individually prepare the first and second organic photoelectric conversion elements under desired conditions. In addition, in the first and second organic photoelectric conversion elements, the organic photoelectric conversion units are respectively protected by the first and second protective films, and thus the organic photoelectric conversion units can be protected from gases such as the air. Accordingly, it is possible to measure light by dividing the light for every different wavelength band, and it is possible to simplify manufacturing while protecting the organic photoelectric conversion units.

In the organic photoelectric conversion device according to the aspect of the invention, the first wavelength band may be a wavelength band that is shorter than the second wavelength band. Typically, the organic photoelectric conversion units may tend to slightly receive light with respect to light having a wavelength shorter than a wavelength band relating to the sensitivity of the organic photoelectric conversion unit. In this regard, in the aspect of the invention, after light in the first wavelength band that is a wavelength band shorter than the second wavelength band is received by the first organic photoelectric conversion element, light in the second wavelength band is received by the second organic photoelectric conversion element. According to this, it is possible to suppress light in the second wavelength band from being received by the first organic photoelectric conversion element, and light in the first wavelength band and light in the second wavelength band can be reliably received by the first and second organic photoelectric conversion elements, respectively.

The organic photoelectric conversion device according to the aspect of the invention may further include a multi-band pass filter which is provided on a light incident side of the first organic photoelectric conversion element, and through which the light in the first wavelength band and the light in the second wavelength band are transmitted. According to this, only light in the first wavelength band and light in the second wavelength band can be reliably received by the first and second organic photoelectric conversion elements.

The organic photoelectric conversion device according to the aspect of the invention may further include a first filter which is provided on the light incident side of the first organic photoelectric conversion element and through which the light having a wavelength longer than a lower limit of the first wavelength band is transmitted, and a second filter which is provided between the first organic photoelectric conversion element and the second organic photoelectric conversion element, and blocks the light having a wavelength longer than an upper limit of the second wavelength band. According to this, light in the first wavelength band and light in the second wavelength band can be reliably received by the first and second organic photoelectric conversion elements.

In the organic photoelectric conversion device according to the aspect of the invention, the first and second protective films may be inorganic films, organic films, or stacked films of an inorganic film and an organic film. In the organic photoelectric conversion device according to the aspect of the invention, the first and second protective films may include at least one of alumina, titanium oxide, and polyparaxylylene. In this case, it is possible to effectively protect the organic photoelectric conversion units of the first and second organic photoelectric conversion elements.

In the organic photoelectric conversion device according to the aspect of the invention, the first organic photoelectric conversion element may include a first substrate protective film that covers the first substrate, and the second organic photoelectric conversion element may include a second substrate protective film that covers the second substrate. According to this, the organic photoelectric conversion units of the first and second organic photoelectric conversion elements can be protected from gases included in the first and second substrates.

In the organic photoelectric conversion device according to the aspect of the invention, the first and second transparent electrodes may be electrically connected to an outer side through the first protective film, and the third transparent electrode and the electrode may be electrically connected to the outside through the second protective film. In this case, it is not necessary to remove a part of the first and second protective films for realizing electrical connection with the first and second organic photoelectric conversion elements. The operational effect of simplifying manufacturing while protecting the organic photoelectric conversion unit becomes significant.

In the organic photoelectric conversion device according to the aspect of the invention, the first organic photoelectric conversion element may include a third protective film that covers an outer surface of the first protective film, and the second organic photoelectric conversion element may include a fourth protective film that covers an outer surface of the second protective film. In this case, it is possible to improve scratch resistance of the first and second organic photoelectric conversion elements by the third and fourth protective films.

In the organic photoelectric conversion device according to the aspect of the invention, the third protective film may not cover a part of the outer surface of the first protective film on a metal interconnection that is electrically connected to the first and second transparent electrodes, and the fourth protective film may not cover a part of the outer surface of the second protective film on a metal interconnection that is electrically connected to the third transparent electrode and the electrode. According to this, even in a case where the third and the fourth protective films are provided, electrical connection with the first and second organic photoelectric conversion elements can be easily realized.

In the organic photoelectric conversion device according to the aspect of the invention, a plurality of the first organic photoelectric conversion elements may be arranged to be stacked along the incident direction of the light, and the first wavelength band of each of the organic photoelectric conversion units in the plurality of first organic photoelectric conversion elements may be a wavelength band different in each case. In this case, it is possible to measure light by dividing the light for each of at least three wavelength bands.

According to another aspect of the invention, there is provided a method for manufacturing an organic photoelectric conversion device. The method includes: a process of vapor-depositing a first transparent electrode, an organic photoelectric conversion unit having sensitivity in a first wavelength band, and a second transparent electrode on a first substrate to obtain a first element main body; a process of covering the first element main body with a first protective film by vapor-deposition or atomic layer deposition to obtain a first organic photoelectric conversion element; a process of vapor-depositing a third transparent electrode, an organic photoelectric conversion unit having sensitivity in a second wavelength band, and an electrode on a second substrate to obtain a second element main body; a process of covering the second element main body with a second protective film by vapor-deposition or atomic layer deposition to obtain a second organic photoelectric conversion element; and a process of disposing the first organic photoelectric conversion element and the second organic photoelectric conversion element to be stacked in this order along an incident direction of light.

According to the method for manufacturing an organic photoelectric conversion device, the first and second organic photoelectric conversion elements are used, and these are disposed to be stacked in this order along the incident direction of light. Accordingly, it is possible to manufacture an organic photoelectric conversion device that measures light by dividing the light for every different wavelength band. The need for optical axis adjustment can be eliminated in the manufacturing. The first and second organic photoelectric conversion elements can be individually modulated, and thus it is easy to individually prepare the first and second organic photoelectric conversion elements under desired conditions. In addition, in the first and second organic photoelectric conversion elements, the organic photoelectric conversion units are respectively protected by the first and second protective films, and thus the organic photoelectric conversion units can be protected from gases such as the air. Accordingly, it is possible to measure light by dividing the light for every different wavelength band, and it is possible to simplify manufacturing while protecting the organic photoelectric conversion units.

The method for manufacturing an organic photoelectric conversion device according to the aspect of the invention may further include a process of providing a multi-band pass filter, through which the light in the first wavelength band and the light in the second wavelength band are transmitted, on a light incident side of the first organic photoelectric conversion element. According to this, in the organic photoelectric conversion device thus manufactured, light in the first wavelength band and light in the second wavelength band can be reliably received by the first and second organic photoelectric conversion elements.

The method for manufacturing an organic photoelectric conversion device according to the aspect of the invention may further include a process of providing a first filter, through which the light having a wavelength longer than a lower limit of the first wavelength band is transmitted, on the light incident side of the first organic photoelectric conversion element, and providing a second filter, which blocks the light having a wavelength longer than an upper limit of the second wavelength band, between the first organic photoelectric conversion element and the second organic photoelectric conversion element. According to this, in the organic photoelectric conversion device thus manufactured, light in the first wavelength band and light in the second wavelength band can be reliably received by the first and second organic photoelectric conversion elements.

The method for manufacturing an organic photoelectric conversion device according to the aspect of the invention may further include: a process of covering the first substrate with a first substrate protective film by vapor-deposition or atomic layer deposition; and a process of covering the second substrate with a second substrate protective film by vapor-deposition or atomic layer deposition. According to this, in the organic photoelectric conversion device thus manufactured, the organic photoelectric conversion units of the first and second organic photoelectric conversion elements can be protected from gases included in the first and second substrates.

The method for manufacturing an organic photoelectric conversion device according to the aspect of the invention may further include a process of covering an outer surface of the first protective film with a third protective film by laminate processing, and covering an outer surface of the second protective film with a fourth protective film by laminate processing. In this case, in an organic photoelectric conversion device thus manufactured, it is possible to improve scratch resistance of the first and second organic photoelectric conversion elements by the third and fourth protective films.

Advantageous Effects of Invention

According to the aspects of the invention, it is possible to provide an organic photoelectric conversion device and a method for manufacturing an organic photoelectric conversion device which are capable of realizing measurement of light by dividing the light for every different wavelength band, and are capable of realizing simplification of manufacturing while protecting an organic photoelectric conversion unit.

BRIEF DESCRIPTION OF DRAWINGS

FIG. 6 is a schematic cross-sectional view illustrating an organic photoelectric conversion device according to a modification example.

DESCRIPTION OF EMBODIMENTS

Figure 1:
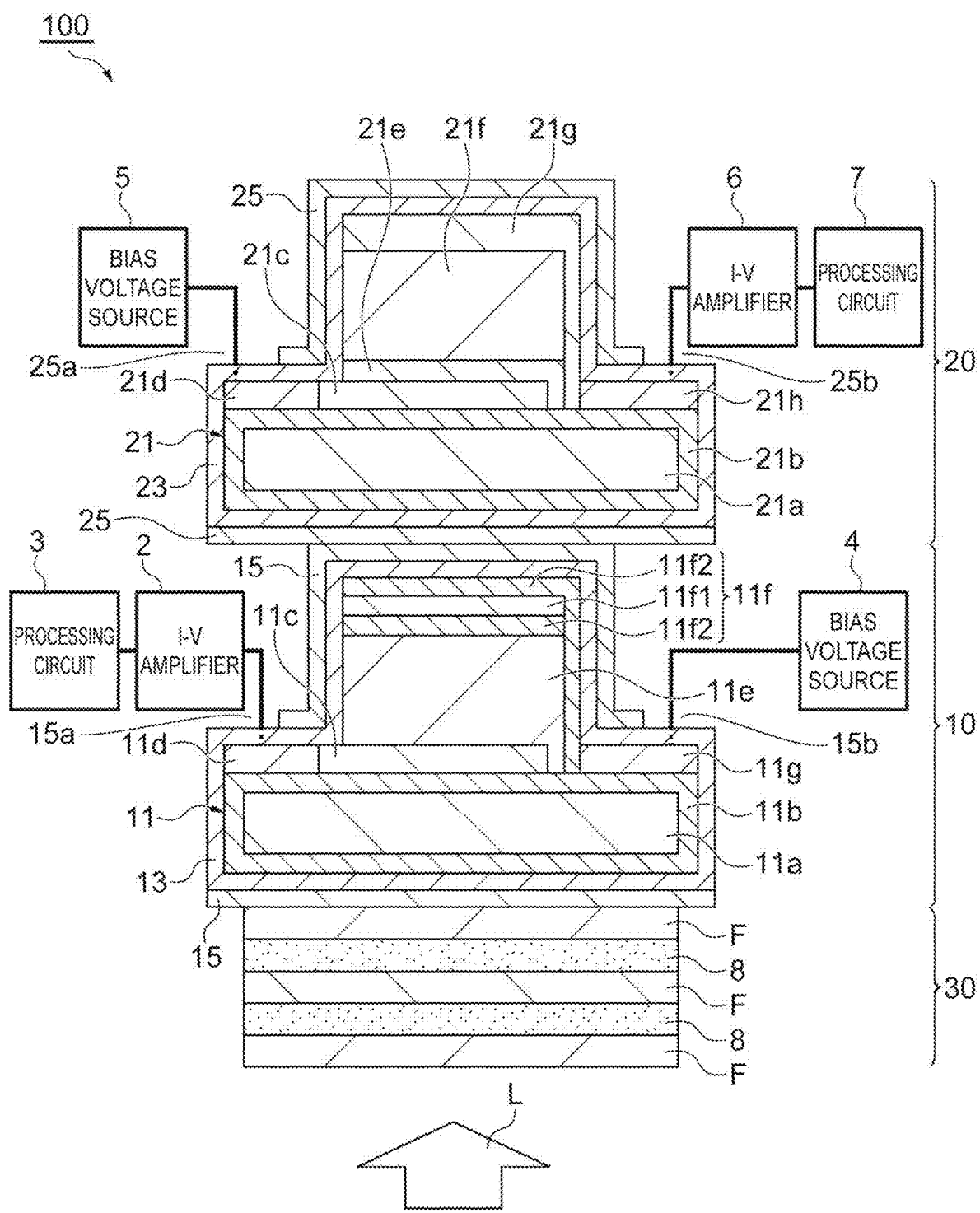
FIG. 1 is a schematic cross-sectional view illustrating an organic photoelectric conversion device according to an embodiment.

Hereinafter, an embodiment will be described in detail with reference to the accompanying drawings. Hereinafter, the same reference numeral will be given of the same or equivalent element, and redundant description thereof will be omitted.

For example, an organic photoelectric conversion device 100 illustrated in FIG. 1 is a thin film type optical device for health care, biochemical inspection, bioanalysis, or radiation nondestructive measurement. The organic photoelectric conversion device 100 is a multi-wavelength detection device capable of simultaneously detecting light beams of a plurality of wavelength bands different from each other. The organic photoelectric conversion device 100 stated here is a two-wavelength detection device that simultaneously detects light in a first wavelength band and light in a second wavelength band. The organic photoelectric conversion device 100 includes a first organic photoelectric conversion element 10, a second organic photoelectric conversion element 20, and a multi-band pass filter 30.

The first organic photoelectric conversion element 10 and the second organic photoelectric conversion element 20 are elements which convert light L into electrical energy. The first organic photoelectric conversion element 10 and the second organic photoelectric conversion element 20 are disposed to be stacked in this order along an incident direction of the light L, and are joined to each other. The first organic photoelectric conversion element 10 and the second organic photoelectric conversion element 20 may be in contact with each other or another optical element may be disposed therebetween.

The first organic photoelectric conversion element 10 is located on an incident side of the light L with respect to the second organic photoelectric conversion element 20. The first organic photoelectric conversion element 10 is a transflective organic photoelectric conversion element through which the light L having a wavelength other than a wavelength of a detection target is transmitted. The first organic photoelectric conversion element 10 includes a first element main body 11, a first main body protective film (first protective film) 13 that covers the first element main body 11 in a surrounding manner, and a first laminate film (third protective film) 15 that covers the first main body protective film 13 in a surrounding manner.

The first element main body 11 includes a first substrate 11a, a first substrate protective film 11b, a transparent electrode (first transparent electrode) 11c, a metal interconnection 11d, an organic photoelectric conversion unit 11e, a transparent electrode (second transparent electrode) 11f, and a metal interconnection 11g.

The first substrate 11a is a film substrate having a film shape. The first substrate 11a is transparent. "Transparent" represents transparency with respect to light L to be detected. For example, "transparent" represents that a total light transmittance is 70% or greater, and specifically, a total light transmittance with respect to light L in a wavelength selection range to be detected is 85% or greater (the same is also true of "transparent" to be described later). "Film" represents, for example, a thin sheet, and "film shape" represents, for example, a thin sheet shape (this is also true of a film and a film shape to be described later). The first substrate 11a is formed from, for example, glass or a resin (polyimide, polyethylene terephthalate, or the like).

The first substrate protective film 11b is a film that covers at least a part of an outer surface of the first substrate 11a. The first substrate protective film 11b has a barrier property against a liquid, a gas such as oxygen, and water vapor. Particularly, the first substrate protective film 11b has a high barrier property against the water vapor (low water vapor permeability). The first substrate protective film 11b is an ALD-formed film that is formed by atomic layer deposition (ALD). The first substrate protective film 11b is transparent. The first substrate protective film 11b is an inorganic film, an organic film, or a stacked film of an inorganic film and an organic film. Here, the first substrate protective film 11b is formed from, for example, a multi-layer structure of alumina ($Al_2O_3$) and titanium oxide ($TiO_2$).

The transparent electrode 11c is a transparent conductive film. The transparent electrode 11c is provided on a surface of the first substrate 11a. The transparent electrode 11c is stacked on the surface of the first substrate 11a through the first substrate protective film 11b. The transparent electrode 11 is in contact with the first substrate protective film 11b. The transparent electrode 11c is formed from, for example, indium tin oxide (ITO). The transparent electrode 11c is electrically connected to the metal interconnection 11d.

The metal interconnection 11d is provided on the surface of the first substrate 11a. The metal interconnection 11d is stacked on the surface of the first substrate 11a through the first substrate protective film 11b. The metal interconnection 11d is in contact with the first substrate protective film 11b. The metal interconnection 11d is electrically conducted to an external I-V amplifier 2 through the first main body protective film 13. That is, the transparent electrode 11c electrically connected to the metal interconnection 11d, and the I-V amplifier 2 are electrically connected to each other through the first main body protective film 13. The first main body protective film 13 exists on an electrical conduction path between the metal interconnection 11d and the I-V amplifier 2, and an opening (removed portion) for the electrical conduction is not provided in the first main body protective film 13. The I-V amplifier 2 is a current and voltage conversion amplifier. The I-V amplifier 2 converts an output signal of the organic photoelectric conversion device 100 into a digital signal, and is electrically connected to, for example, a processing circuit 3 that performs processing of storing a signal amount variation in time series, or the like.

The organic photoelectric conversion unit 11e is a photoelectric conversion film including an organic semiconductor. The organic photoelectric conversion unit 11e is a light-receiving unit having sensitivity in the first wavelength band of the light L. In the organic photoelectric conversion unit 11e stated here, boron subphthalocyanine chloride (SubPc) is used as a donor material, and carbon molecule fullerene (Buckminster fullerene: C60) is used as an acceptor material. The first wavelength band is a wavelength band shorter than the second wavelength band. For example, the first wavelength band is 541 nm to 551 nm. The organic photoelectric conversion unit 11e is provided on the transparent electrode 11c. The organic photoelectric conversion unit 11e is stacked on a surface opposite to the first substrate 11a side in the transparent electrode 11c.

The transparent electrode 11f is a transparent conductive film. The transparent electrode 11f is a metal dielectric stacked film (metal-dielectric-multilayer: MDM) including a metal 11f1 and a dielectric substance 11f2. The transparent electrode 11f is provided on the organic photoelectric conversion unit 11e. The transparent electrode 11f is stacked on a surface opposite to the first substrate 11a side in the organic photoelectric conversion unit 11e. The transparent electrode 11f faces the transparent electrode 11c through the organic photoelectric conversion unit 11e. The transparent electrode 11f and the transparent electrode 11c are disposed to be offset from each other in a direction orthogonal to a stacking direction. The metal 11f1 of the transparent electrode 11c is formed from, for example, gold (Au). The dielectric substance 11f2 of the transparent electrode 11c is formed from, for example, molybdenum trioxide ($MoO_3$). The transparent electrode 11f is electrically connected to the metal interconnection 11g. The transparent electrode 11f is not in contact with the transparent electrode 11c. The transparent electrode 11f is not electrically connected to the transparent electrode 11c.

The metal interconnection 11g is provided on the surface of the first substrate 11a. The metal interconnection 11g is stacked on the surface of the first substrate 11a through the first substrate protective film 11b. The metal interconnection 11g is in contact with the first substrate protective film 11b. The metal interconnection 11g is electrically conducted to an external bias voltage source 4 through the first main body protective film 13. That is, the transparent electrode 11f electrically connected to the metal interconnection 11g, and the bias voltage source 4 are electrically connected to each other through the first main body protective film 13. The first main body protective film 13 exists on an electrical conduction path between the metal interconnection 11g and the bias voltage source 4, and the first main body protective film 13 is not provided with an opening (removed portion) for the electrical conduction. The bias voltage source 4 supplies a voltage to be applied to the organic photoelectric conversion unit 11e. The bias voltage source 4 stated here supplies a negative voltage, specifically, a voltage of approximately −5 V to 0 V for operation.

The first main body protective film 13 is a film that covers at least a part of an outer surface of the first element main body 11. The first main body protective film 13 has a barrier property against a liquid, a gas such as oxygen, and water vapor. Particularly, the first main body protective film 13 has a high barrier property against the water vapor. The first main body protective film 13 is an ALD-formed film that is formed by the ALD. The first main body protective film 13 is transparent. The first main body protective film 13 is an inorganic film, an organic film, or a stacked film of an inorganic film and an organic film. The first main body protective film 13 is formed by, for example, a multi-layer structure of alumina and titanium oxide.

A first laminate film 15 is a film that covers at least a part of an outer surface of the first main body protective film 13. The first laminate film 15 covers a light incident side and a side opposite to the light incident side in the outer surface of the first main body protective film 13. The first laminate film 15 is formed by laminate processing. The first laminate film 15 is formed by joining one or a plurality of films. The first laminate film 15 is formed from a material strong against physical impact. The first laminate film 15 is transparent. The first laminate film 15 is provided with an exposure portion 15a through which a part of the outer surface of the first main body protective film 13 on the metal interconnection 11d is exposed so as not to be covered. The first laminate film 15 is provided with an exposure portion 15b through which a part of the outer surface of the first main body protective film 13 on the metal interconnection 11g is exposed so as not be covered. Note that, with regard to the parts of the first main body protective film 13 on the metal interconnections 11d and 11g, the parts may be removed, for example, with laser light irradiation or plasma irradiation to expose the metal interconnections 11d and 11g.

The second organic photoelectric conversion element 20 is located on a side opposite to the incident side of the light L with respect to the first organic photoelectric conversion element 10. The second organic photoelectric conversion element 20 is a non-transmissive organic photoelectric conversion element. The second organic photoelectric conversion element 20 includes a second element main body 21, a second main body protective film (second protective film) 23 that covers the second element main body 21 in a surrounding manner, and a second laminate film (fourth protective film) 25 that covers the second main body protective film 23 in a surrounding manner.

The second element main body 21 includes a second substrate 21a, a second substrate protective film 21b, a transparent electrode (third transparent electrode) 21c, a metal interconnection 21d, a buffer layer 21e, an organic photoelectric conversion unit 21f, a non-transparent electrode (electrode) 21g, and a metal interconnection 21h.

The second substrate 21a is a film substrate having a film shape. The second substrate 21a is transparent. The second substrate 21a is formed from, for example, glass or a resin.

The second substrate protective film 21b is a film that covers at least a part of an outer surface of the second substrate 21a. The second substrate protective film 21b has a barrier property against a liquid, a gas such as oxygen, and water vapor. Particularly, the second substrate protective film 21b has a high barrier property against the water vapor. The second substrate protective film 21b is an ALD-formed film that is formed by the ALD. The second substrate protective film 21b is transparent. The second substrate protective film 21b is an inorganic film, an organic film, or a stacked film of an inorganic film and an organic film. Here, the second substrate protective film 21b is formed by, for example, a multi-layer structure of alumina and titanium oxide.

The transparent electrode 21c is a transparent conductive film. The transparent electrode 21c is provided on a surface of the second substrate 21a. The transparent electrode 21c is stacked on the surface of the second substrate 21a through the second substrate protective film 21b. The transparent electrode 21c is in contact with the second substrate protective film 21b. The transparent electrode 21c is formed from, for example, indium tin oxide. The transparent electrode 21c is electrically connected to the metal interconnection 21d.

The metal interconnection 21d is provided on a surface of the second substrate 21a. The metal interconnection 21d is stacked on the surface of the second substrate 21a through the second substrate protective film 21b. The metal interconnection 21d is in contact with the second substrate protective film 21b. The metal interconnection 21d is electrically conducted to an external bias voltage source 5 through the second main body protective film 23. That is, the transparent electrode 21c electrically connected to the metal interconnection 21d, and the bias voltage source 5 are electrically connected to each other through the second main body protective film 23. The second main body protective film 23 exists on an electrical conduction path between the metal interconnection 21d and the bias voltage source 5, and the second main body protective film 23 is not provided with an opening (removed portion) for the electrical conduction. The bias voltage source 5 supplies a voltage to be applied to the organic photoelectric conversion unit 21f. The bias voltage source 5 stated here supplies a negative voltage, specifically, a voltage of approximately −5 V to 0 V for operation.

The buffer layer 21e adjusts an energy rank between the transparent electrode 21c and the organic photoelectric conversion unit 21f, and suppresses a dark current. The buffer layer 21e is constituted by a metal oxide film. The buffer layer 21e is formed from, for example, molybdenum trioxide. The buffer layer 21e is transparent. The buffer layer 21e is provided on the transparent electrode 21c. The buffer layer 21e is stacked on a surface opposite to the second substrate 21a side in the transparent electrode 21c.

The organic photoelectric conversion unit 21f is a photoelectric conversion film including an organic semiconductor. The organic photoelectric conversion unit 21f is a light-receiving unit having sensitivity in the second wavelength band of the light L. In the organic photoelectric conversion unit 21f stated here, phthalocyanine copper (CuPc) is used as a donor material, and carbon molecule fullerene is used as an acceptor material. The second wavelength is a wavelength band longer than the first wavelength band. For example, the second wavelength is 685 nm to 695 nm. The organic photoelectric conversion unit 21f is provided on the buffer layer 21e. The organic photoelectric conversion unit 21f is stacked on a surface opposite to the second substrate 21a side in the buffer layer 21e. At least a part of the organic photoelectric conversion unit 21f is disposed to overlap the organic photoelectric conversion unit 11e of the first organic photoelectric conversion element 10 when viewed from the incident direction of the light L. That is, an arrangement region of the organic photoelectric conversion unit 11e and an arrangement region of the organic photoelectric conversion unit 21f overlap each other when viewed from the incident direction of the light L.

The non-transparent electrode 21g is a conductive film that is not transparent. The non-transparent electrode 21g is provided on the organic photoelectric conversion unit 21f. The non-transparent electrode 21g is stacked on a surface opposite to the second substrate 21a side in the organic photoelectric conversion unit 21f. The non-transparent electrode 21g faces the transparent electrode 21c through the organic photoelectric conversion unit 21f. The non-transparent electrode 21g and the transparent electrode 21c are disposed to be offset from each other in a direction orthogonal to a stacking direction. The non-transparent electrode 21g is formed by a two-layer film of titanium and aluminum, or aluminum. The non-transparent electrode 21g is electrically connected to the metal interconnection 21h. The non-transparent electrode 21g is not in contact with the transparent electrode 21c. The non-transparent electrode 21g is not electrically connected to the transparent electrode 21c.

The metal interconnection 21h is provided on the surface of the second substrate 21a. The metal interconnection 21h is stacked on the surface of the second substrate 21a through the second substrate protective film 21b. The metal interconnection 21h is in contact with the second substrate protective film 21b. The metal interconnection 21h is electrically conducted to an external I-V amplifier 6 through the second main body protective film 23. That is, the non-transparent electrode 21g electrically connected to the metal interconnection 21h, and the I-V amplifier 6 are electrically connected to each other through the second main body protective film 23. The second main body protective film 23 exists on an electrical conduction path between the metal interconnection 21h and the I-V amplifier 6, and the second main body protective film 23 is not provided with an opening (removed portion) for the electrical conduction. The I-V amplifier 6 is a current and voltage conversion amplifier. The I-V amplifier 6 converts an output signal of the organic photoelectric conversion device 100 into a digital signal, and is electrically connected to, for example, a processing circuit 7 that performs processing of storing a signal amount variation in time series, or the like.

The second main body protective film 23 is a film that covers at least a part of an outer surface of the second element main body 21. The second main body protective film 23 has a barrier property against a liquid, a gas such as oxygen, and water vapor. Particularly, the first main body protective film 13 has a high barrier property against the water vapor. The second main body protective film 23 is an ALD-formed film that is formed by the ALD. The second main body protective film 23 is transparent. The second main body protective film 23 is an inorganic film, an organic film, or a stacked film of an inorganic film and an organic film. The second main body protective film 23 is formed, for example, a multi-layer structure of alumina and titanium oxide.

The second laminate film 25 is a film that covers at least a part of the outer surface of the second main body protective film 23. The second laminate film 25 covers a light incident side and a side opposite to the light incident side in the outer surface of the second main body protective film 23. The second laminate film 25 is formed by laminate processing. The second laminate film 25 is formed by joining one or a plurality of films. The second laminate film 25 is formed from a material strong against physical impact. The second laminate film 25 is transparent. The second laminate film 25 is provided with an exposure portion 25a through which a part of the outer surface of the second main body protective film 23 on the metal interconnection 21d is exposed so as not to be covered. The second laminate film 25 is provided with an exposure portion 25b through which a part of the outer surface of the second main body protective film 23 on the metal interconnection 21h is exposed so as not to be covered.

Figure 2:
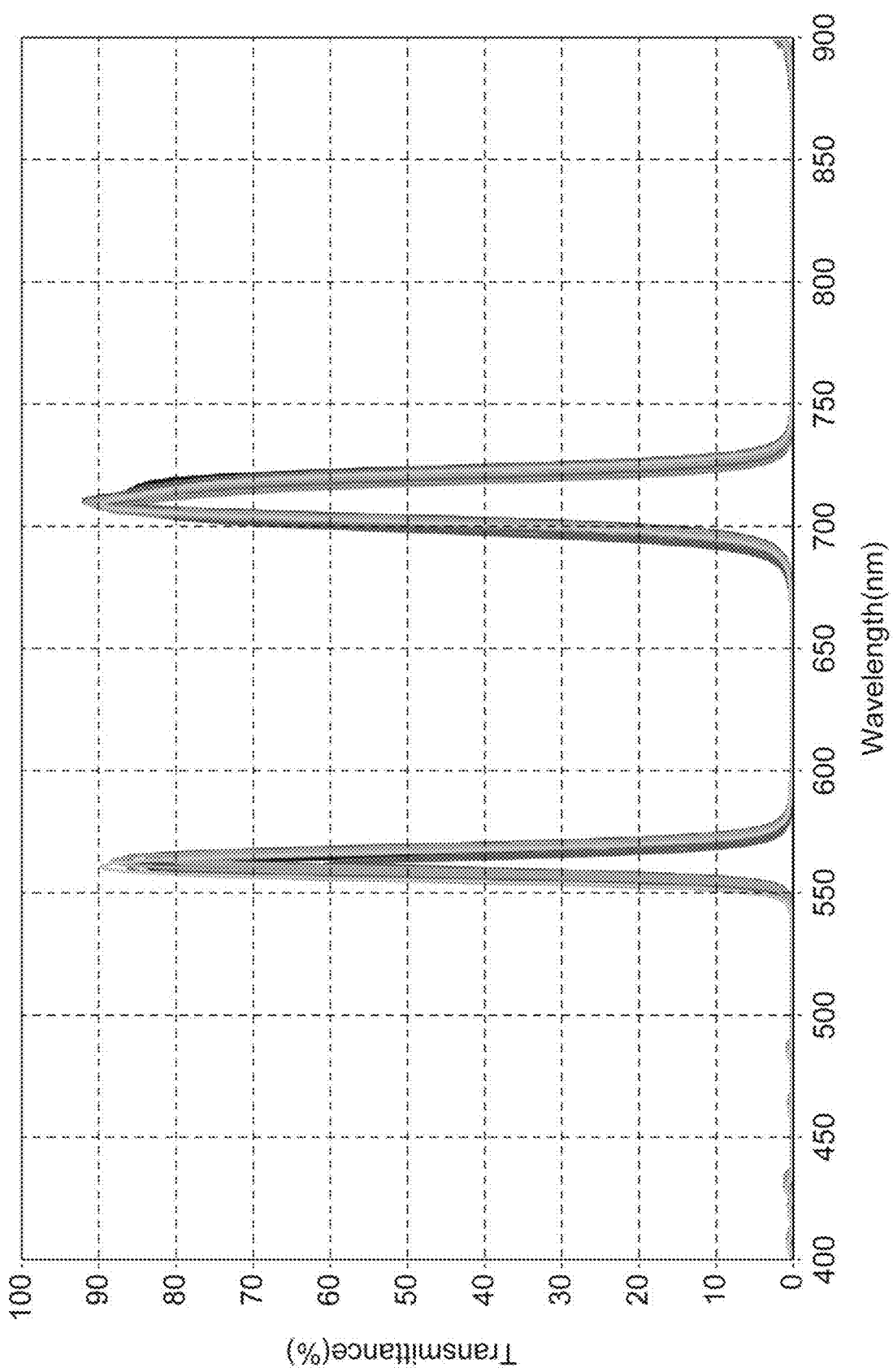
FIG. 2 is a graph showing characteristics of a band pass filter illustrated in FIG. 1.

The multi-band pass filter 30 is joined to a light incident side of the first organic photoelectric conversion element 10. The multi-band pass filter 30 has a structure in which a plurality of filters F are stacked through an adhesive 8 along the incident direction of the light L. The multi-band pass filter 30 and the first organic photoelectric conversion element 10 may be in contact with each other, and another optical element may be disposed therebetween. The multi-band pass filter 30 is a band pass filter having a relationship between a wavelength and a transmittance as shown in FIG. 2, and has a first wavelength band and a second wavelength band as a transmission band (transmission wavelength region).

Next, description will be given of a method for manufacturing the organic photoelectric conversion device 100 configured as described above.

Figure 3:
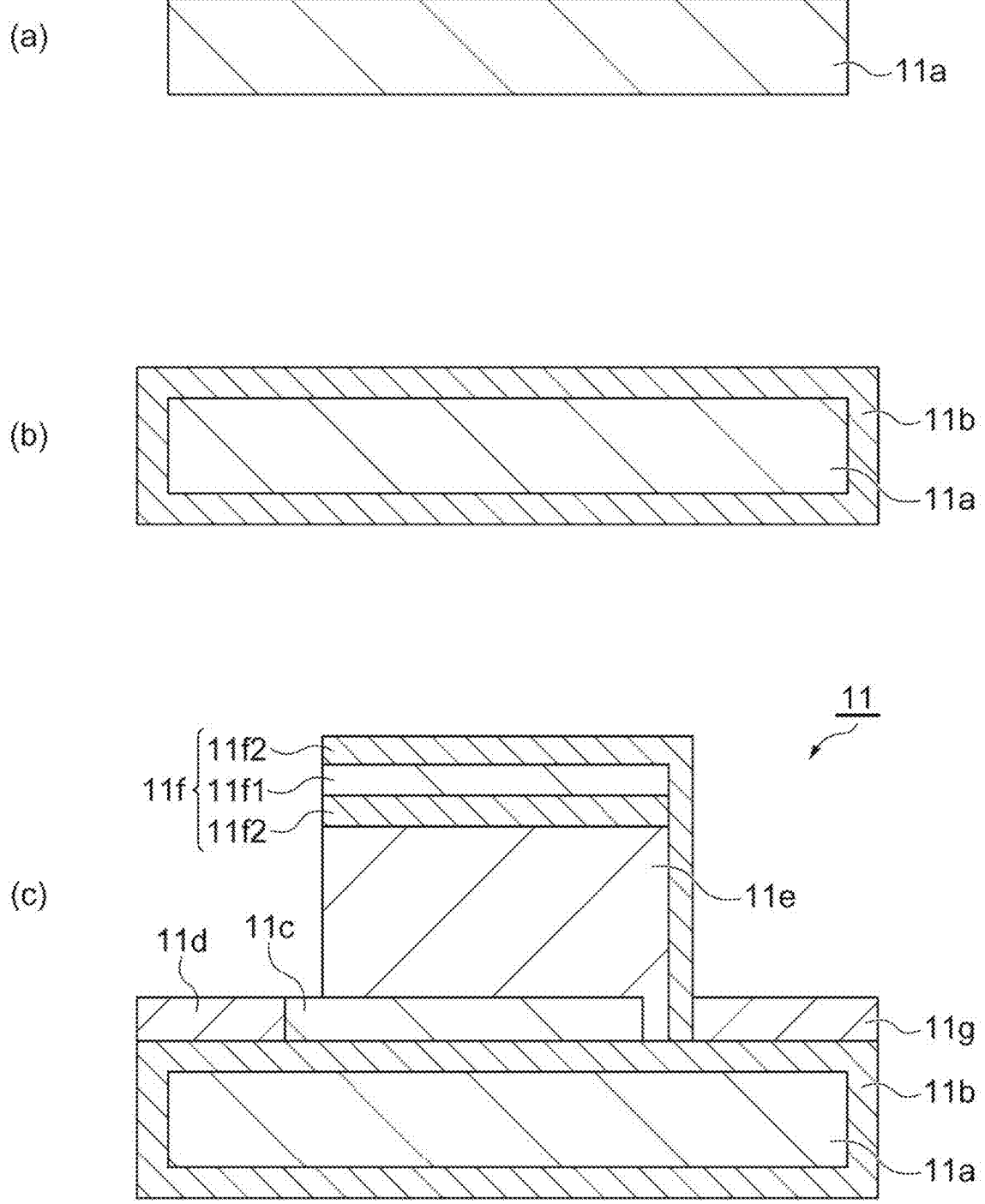
FIG. 3(a) is a schematic cross-sectional view describing a method for manufacturing the organic photoelectric conversion device illustrated in FIG. 1.
FIG. 3(b) is a schematic cross-sectional view illustrating a continuation of FIG. 3(a)
FIG. 3(c) is a schematic cross-sectional view illustrating a continuation of FIG. 3(b).

First, as illustrated in FIG. 3(a), the first substrate 11a is prepared. As illustrated in FIG. 3(b), the first substrate protective film 11b is formed by the ALD to cover the outer surface of the first substrate 11a. As illustrated in FIG. 3(c), the transparent electrode 11c, the metal interconnection 11d, the organic photoelectric conversion unit 11e, the transparent electrode 11f, and the metal interconnection 11g are vapor-deposited on the first substrate 11a on which the first substrate protective film 11b is formed. According to this, the first element main body 11 is obtained.

Figure 4:
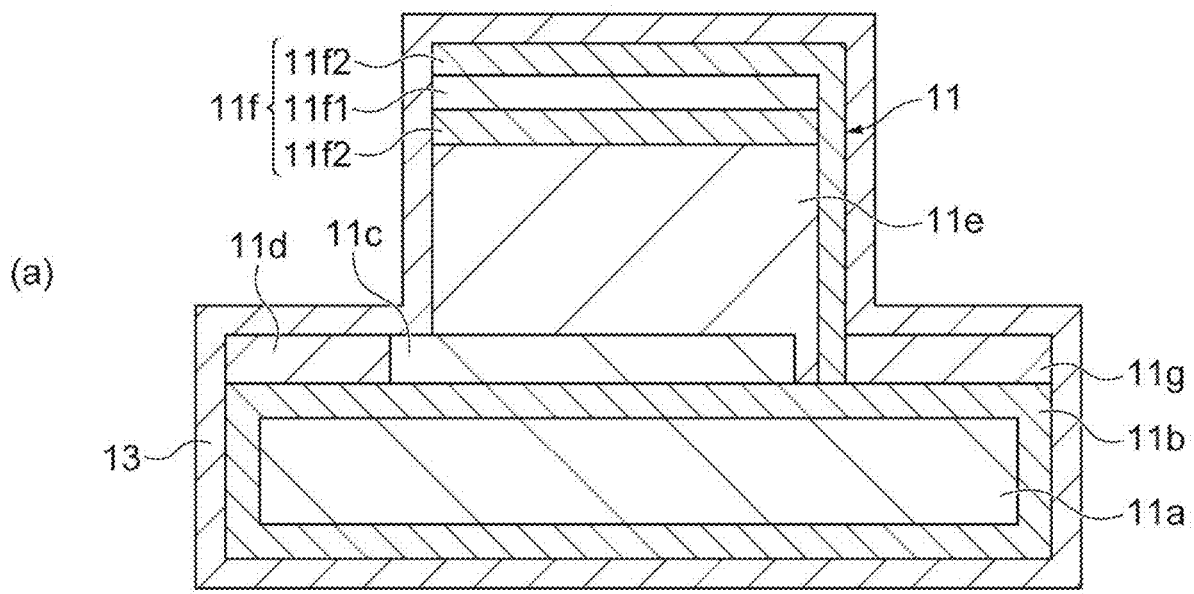
FIG. 4(a) is a schematic cross-sectional view illustrating a continuation of FIG. 3(c)
FIG. 4(b) is a schematic cross-sectional view illustrating a continuation of FIG. 4(a).
Figure 4:
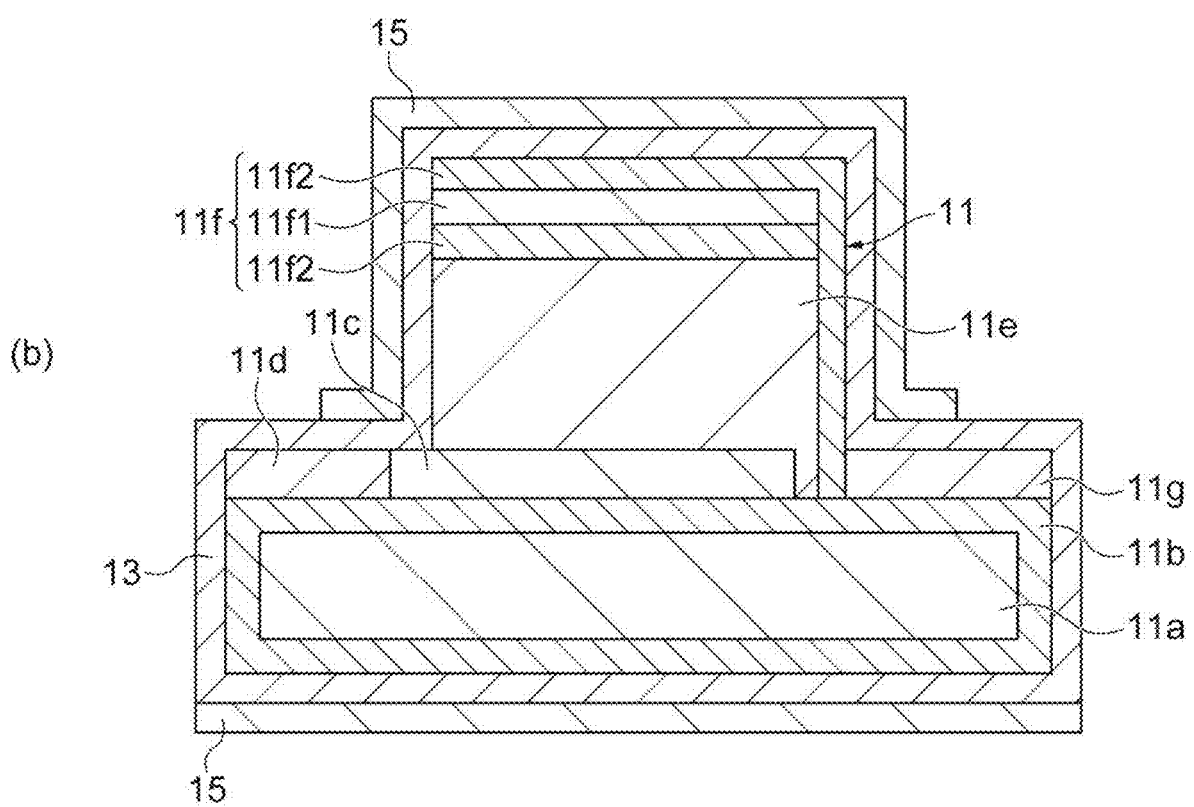

As illustrated in FIG. 4(a), the first main body protective film 13 is formed by the ALD to cover the outer surface of the first element main body 11. As illustrated in FIG. 4(b), laminate processing is performed to cover the first element main body 11 on which the first main body protective film 13 is formed to form the first laminate film 15. The metal interconnection 11d is electrically connected to the external I-V amplifier 2 through the first main body protective film 13. The metal interconnection 11g is electrically connected to the external bias voltage source 4 through the first main body protective film 13. According to this, the first organic photoelectric conversion element 10 is obtained.

Separately from formation of the first organic photoelectric conversion element 10, the second organic photoelectric conversion element 201 is obtained in the same manner as in FIG. 3(a) to FIG. 4(b). That is, the second substrate protective film 22b is formed to cover the outer surface of the second substrate 21a. The transparent electrode 21c, the metal interconnection 21d, the buffer layer 21e, the organic photoelectric conversion unit 21f, the non-transparent electrode 21g, and the metal interconnection 21h are vapor-deposited on the second substrate 21a to obtain the second element main body 21. The second main body protective film 23 is formed to cover the outer surface of the second element main body 21. Laminate processing is performed to form the second laminate film 25. The metal interconnection 21d is electrically connected to the external bias voltage source 5 through the second main body protective film 23, and the metal interconnection 21h is electrically connected to the external I-V amplifier 6 through the second main body protective film 23. According to this, the second organic photoelectric conversion element 20 is obtained.

The first organic photoelectric conversion element 10 and the second organic photoelectric conversion element 20 which are obtained are disposed to be stacked in this order along the incident direction of the light L, and are joined to each other. The multi-band pass filter 30 is provided on a light incident side of the first organic photoelectric conversion element 10. In this manner, the organic photoelectric conversion device 100 is manufactured.

As described above, in the organic photoelectric conversion device 100, the first and second organic photoelectric conversion elements 10 and 20 are disposed to be stacked in this order along the incident direction of the light L, and the light L is measured in a state of being divided for every different wavelength band. According to this stacked structure, the need for optical axis adjustment can be eliminated. Since the first and second organic photoelectric conversion elements 10 and 20 can be individually modulated, it is easy to individually manufacture the first and second organic photoelectric conversion elements 10 and 20 under desired conditions. In addition, in the first and second organic photoelectric conversion elements 10 and 20, the organic photoelectric conversion units 11e and 21f are respectively protected by the first and second main body protective films 13 and 23, and the organic photoelectric conversion units 11e and 21f can be protected from gases (including water vapor) such as the air.

Accordingly, according to the organic photoelectric conversion device 100, it is possible to measure the light L in a state of dividing the light L for every different wavelength band, and it is possible to simplify an optical system of a device and manufacturing of the device while protecting the organic photoelectric conversion units 11e and 21f. A reduction in size of the organic photoelectric conversion device 100 is possible. Since protection can be realized by the first and second main body protective films 13 and 23, environment resistance can be enhanced, and in a case where the first and second organic photoelectric conversion elements 10 and 20 are joined through an adhesive, resistance to the adhesive can be enhanced.

Typically, an organic photoelectric conversion unit tends to slightly receive light having a wavelength shorter than a wavelength band relating to the sensitivity of the organic photoelectric conversion unit. In this regard, in the organic photoelectric conversion device 100, the first wavelength band of the organic photoelectric conversion unit 11e of the first organic photoelectric conversion element 10 is a wavelength band shorter than the second wavelength band of the organic photoelectric conversion unit 21f of the second organic photoelectric conversion element 20. According to this, after the light L in the first wavelength band that is a wavelength band shorter than the second wavelength band is received by the first organic photoelectric conversion element 10, the light L in the second wavelength band is received by the second organic photoelectric conversion element 20. According to this, spectroscopic measurement with accuracy corresponding to characteristics of the organic photoelectric conversion units 11e and 21f becomes possible, and it is possible to suppress the light L in the second wavelength band from being received by the first organic photoelectric conversion element 10, and the light L in the first wavelength band and the light L in the second wavelength band can be reliably received by the first and second organic photoelectric conversion elements 10 and 20, respectively.

The organic photoelectric conversion device 100 includes the multi-band pass filter 30. According to this, the light L in the first wavelength band and the light L in the second wavelength band can be reliably received by the first and second organic photoelectric conversion elements 10 and 20, respectively.

In the organic photoelectric conversion device 100, the first and second main body protective films 13 and 23 are inorganic films, organic films, or stacked films of an inorganic film and an organic film. Particularly, in the organic photoelectric conversion device 100, the first and second protective films include alumina and titanium oxide. According to this, it is possible to effectively protect the organic photoelectric conversion units 11e and 21f of the first and second organic photoelectric conversion elements 10 and 20.

In the organic photoelectric conversion device 100, the first organic photoelectric conversion element 10 includes the first substrate protective film 11b that covers the first substrate 11a. The second organic photoelectric conversion element 20 includes the second substrate protective film 21b that covers the second substrate 21a. According to this, it is possible to reduce moisture permeability of the first and second substrates 11a and 21a. The organic photoelectric conversion units 11e and 21f of the first and second organic photoelectric conversion elements 10 and 20 can be protected from gases (including water vapor) included in the first and second substrates 11a and 21a.

In the organic photoelectric conversion device 100, the first main body protective film 13 is thin, and thus the transparent electrodes 11c and 11f are electrically connected to the outside through the first main body protective film 13. The second main body protective film 23 is thin, and thus the transparent electrodes 21c and the non-transparent electrode 21g are electrically connected to the outside through the second main body protective film 23. In this case, it is not necessary to remove a part of the first and second main body protective films 13 and 23 for realizing electrical connection with the first and second organic photoelectric conversion elements 10 and 20. A protection function of the first and second main body protective films 13 and 23 can be sufficiently exhibited. The above-described operational effect of simplifying manufacturing while protecting the organic photoelectric conversion units 11e and 21f becomes significant. Note that, the first and second main body protective films 13 and 23 which are electrical connection portions in which contact capacitance increases may be removed, for example, with laser light irradiation or plasma irradiation as described above in consideration of application to measurement of highly repetitive events.

In the organic photoelectric conversion device 100, the first organic photoelectric conversion element 10 further includes the first laminate film 15, and the second organic photoelectric conversion element 20 further includes the second laminate film 25. It is possible to improve scratch resistance of the first and second organic photoelectric conversion elements 10 and 20 by the first and second laminate films 15 and 25.

In the organic photoelectric conversion device 100, the first laminate film 15 does not cover a part of the outer surface of the first main body protective film 13 on the metal interconnections 11d and 11g. The second laminate film 25 does not cover a part of the outer surface of the second main body protective film 23 on the metal interconnections 21d and 21h. According to this, even in a case where the first and second laminate films 15 and 25 are provided, electrical connection with the first and second organic photoelectric conversion elements 10 and 20 can be easily realized. In a case where the first and second laminate films 15 and 25 are provided, it is possible to prevent electrical conduction with the first and second organic photoelectric conversion elements 10 and 20 from being difficult.

In the method for manufacturing the organic photoelectric conversion device 100, the first and second organic photoelectric conversion elements 10 and 20 are used, and these are disposed to be stacked in this order along the incident direction of light L. Accordingly, it is possible to manufacture the organic photoelectric conversion device 100 that measures light L by dividing the light L for every different wavelength band. The need for optical axis adjustment can be eliminated in the manufacturing. The first and second organic photoelectric conversion elements 10 and 20 can be individually modulated, and thus it is easy to individually prepare the first and second organic photoelectric conversion elements 10 and 20 under desired conditions. In addition, in the first and second organic photoelectric conversion elements 10 and 20, the organic photoelectric conversion units 11e and 21f are respectively protected by the first and second protective films, and thus the organic photoelectric conversion units 11e and 21f can be protected from gases such as the air. Accordingly, it is possible to measure the light L by dividing the light L for every different wavelength band, and it is possible to simplify manufacturing while protecting the organic photoelectric conversion units 11e and 21f.

In the method for manufacturing the organic photoelectric conversion device 100, the multi-band pass filter 30 is provided on the light incident side of the first organic photoelectric conversion element 10. According to this, in the organic photoelectric conversion device 100 thus manufactured, the light L is filtered by the multi-band pass filter 30, and narrowing of a detection wavelength range is performed, and thus the light L in the first wavelength band and the light L in the second wavelength band can be reliably received by the first and second organic photoelectric conversion elements 10 and 20.

In the method for manufacturing the organic photoelectric conversion device 100, the first substrate 11a is covered with the first substrate protective film 11b by using the ALD. The second substrate 21a is covered with the second substrate protective film 21b by the ALD. According to this, in the organic photoelectric conversion device 100 thus manufactured, the organic photoelectric conversion units 11e and 21f of the first and second organic photoelectric conversion elements 10 can be protected from gases included in the first and second substrates 11a and 21a.

In the method for manufacturing the organic photoelectric conversion device 100, the outer surface of the first main body protective film 13 is covered with the first laminate film 15 by laminate processing. In combination with this, the outer surface of the second main body protective film 23 is covered with the second laminate film 25 by laminate processing. In this case, in the organic photoelectric conversion device 100 thus manufactured, it is possible to improve scratch resistance of the first and second organic photoelectric conversion elements 10 and 20 by the first and second laminate films 15 and 25.

In the organic photoelectric conversion device 100, the transparent electrode 11f and the transparent electrode 11c are disposed to be offset in a direction orthogonal to the stacking direction, and the non-transparent electrode 21g and the transparent electrode 21c are disposed to be offset in a direction orthogonal to the stacking direction. According to this, electrical connection of the transparent electrodes 11c, 11f, and 21c and the non-transparent electrode 21g to the outside becomes easy.

Figure 5:
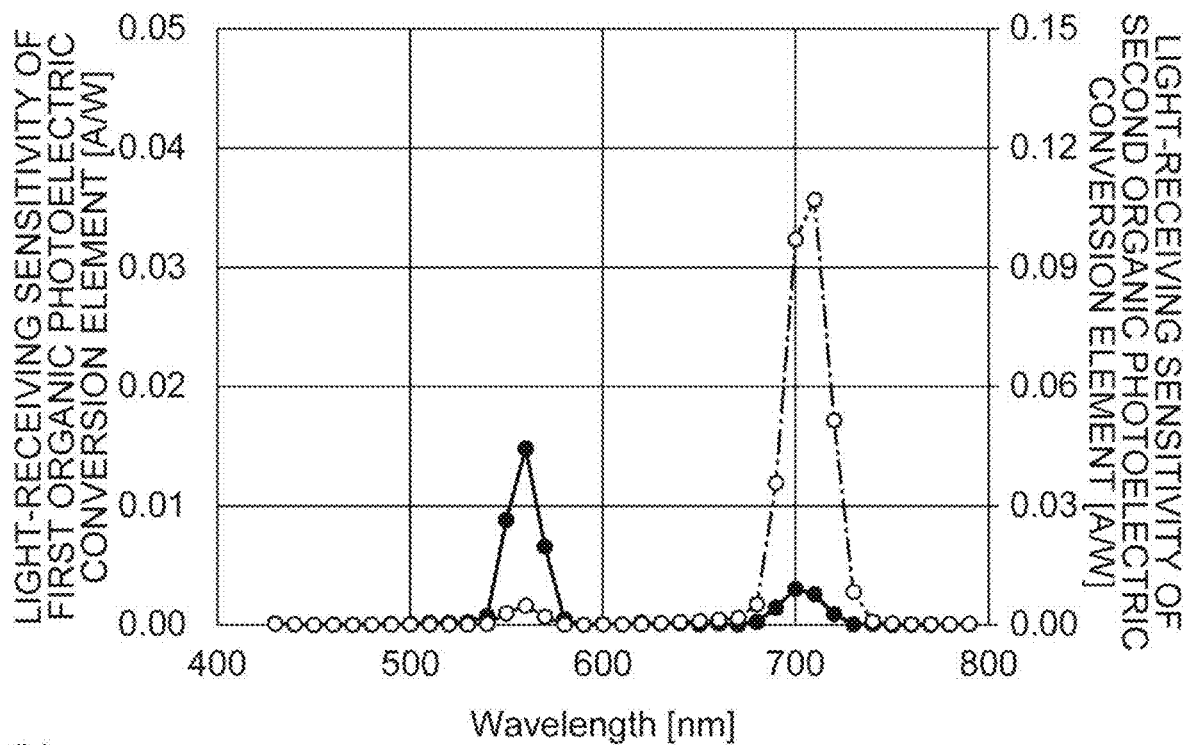
FIG. 5(a) is a graph showing a measurement result of light-receiving sensitivity of the organic photoelectric conversion device.
FIG. 5(b) is a graph showing a measurement result of a light-receiving sensitivity of the organic photoelectric conversion device in a case where a first organic photoelectric conversion element is inverted and disposed.
Figure 5:
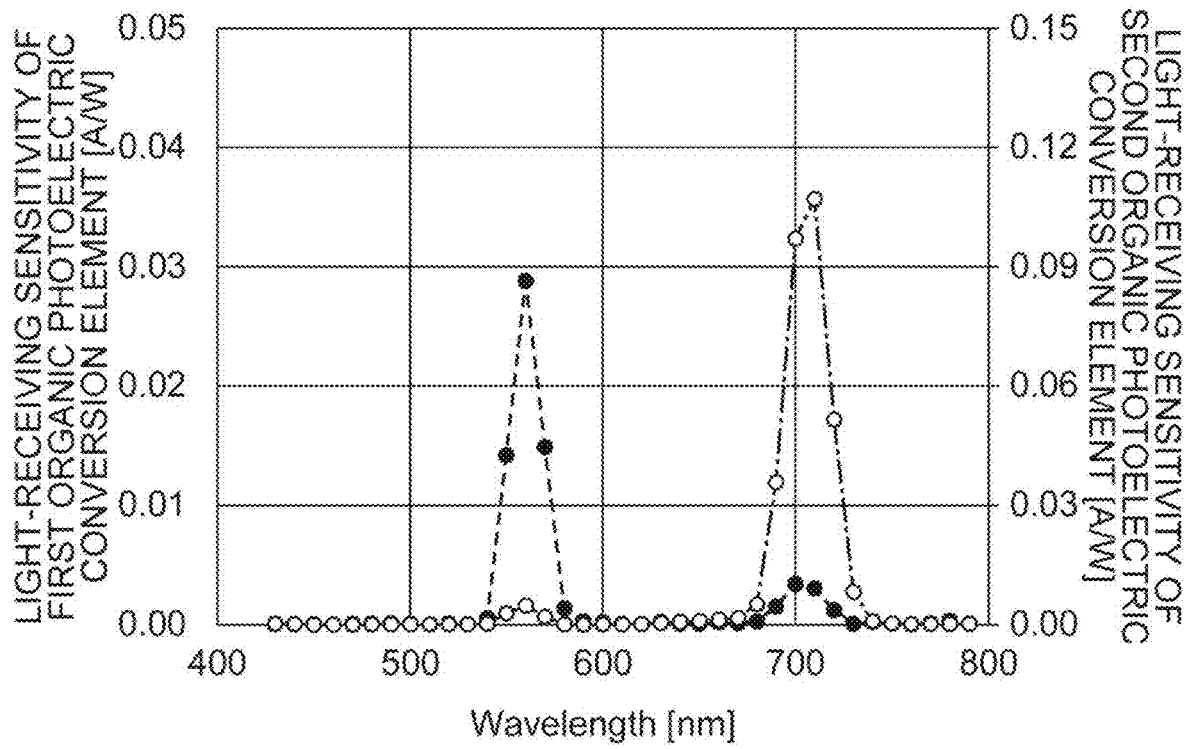

FIG. 5(a) is a graph showing a measurement result of light-receiving sensitivity of the organic photoelectric conversion device 100. In the drawing, the vertical axis represents light-receiving sensitivity (output) of the first and second organic photoelectric conversion elements 10 and 20, and the horizontal axis represents a wavelength of the light L (this is true of FIG. 5(b) and FIG. 6 to be described later). As shown in FIG. 5(a), in the organic photoelectric conversion device 100, it can be confirmed that the light L in the first wavelength band and the light L in the second wavelength band are simultaneously detected with accuracy.

Note that, the first organic photoelectric conversion element 10 may have a vertically inverted structure with respect to a state illustrated in FIG. 1, that is, an inverted structure so that the transparent electrode 11f as the MDM is located on the incident side. Even in this case, it is possible to simultaneously detect the light L in the first wavelength band and the light L in the second wavelength band.

FIG. 5(b) is a graph showing a measurement result of the light-receiving sensitivity of the organic photoelectric conversion device 100 in a case where the first organic photoelectric conversion element 10 is inverted and disposed so that the transparent electrode 11f is located on the incident side. As shown in FIG. 5(b), even in the organic photoelectric conversion device 100 in which the first organic photoelectric conversion element 10 is inverted and disposed, it can be confirmed that the light L in the first wavelength band and the light L in the second wavelength band are simultaneously detected with accuracy. In addition, in comparison to the structure (the result in FIG. 5(a)) in which the transparent electrode 11c that is ITO is located on the incident side, in the inverted structure (the result in FIG. 5(b)) so that the transparent electrode 11f as the MDM is located on the incident side, high light-receiving sensitivity is realized.

In the organic photoelectric conversion device 100, MDM is employed as the transparent electrode 11f of the first organic photoelectric conversion element 10. According to this, it is possible to raise a yield ratio at the time of vapor-deposition of the transparent electrode 11f to the organic photoelectric conversion unit 11e using boron subphthalocyanine chloride and carbon molecule fullerene while securing a transmission property of the transparent electrode 11f with respect to the light L.

Here, a barrier property evaluation test for evaluating a barrier property against water vapor was performed with respect to the first and second main body protective films 13 and 23, and the first and second substrate protective films 11b and 21b. In the barrier property evaluation test, ALD-formed films corresponding to the first and second main body protective films 13 and 23, and the first and second substrate protective films 11b and 21b were formed on a film substrate formed from polyimide, and examples were obtained. The ALD-formed film was formed by a multi-layer structure of alumina and titanium oxide. Here, an alumina layer and a titanium oxide layer were alternately deposited, and the ALD-formed films having a multi-layer structure of a total of 30 layers were obtained. In addition, a comparative example including only a film substrate formed from polyimide was prepared. Water vapor was caused to permeate the examples and the comparative example, and the water vapor permeability (g/m$^2$·day) was measured by an MOCON method or a calcium method. The barrier property evaluation test was performed in accordance with JIS K7129 (infrared sensor method).

From a result of the barrier property evaluation test, it could be seen that the water vapor permeability of the comparative example was 134 (g/m$^2$·day), and in the examples, the water vapor permeability can decrease up to 0.36 (g/m$^2$·day). According to this, it could be confirmed that the organic photoelectric conversion device 100 has a high barrier property against water vapor.

A durability test in the air was performed using an example corresponding to the second organic photoelectric conversion element 20, and a comparative example corresponding to the second organic photoelectric conversion element 20 in which the second substrate protective film 22b and the second main body protective film 23 are not provided. In the durability test, a light-receiving sensitivity variation for 26 days was evaluated. The light-receiving sensitivity was set to relative sensitivity with an initial state set to 1. As a result, in the comparative example, the relative sensitivity decreased up to 70% after passage of 20 days. In contrast, in the example, relative sensitivity of 90% or greater could be maintained even after passage of 26 days. According to this, high durability of the organic photoelectric conversion device 100 could be confirmed.

Note that, in the embodiment, the first and second substrate protective films 11b and 21b, and the first and second main body protective films 13 and 23 include alumina to which titanium oxide is added, but may include at least any one of alumina, titanium oxide, and polyparaxylylene. In this embodiment, at least any one of the first and second substrate protective films 11b and 21b, and the first and second main body protective films 13 and 23 may be formed from the same material or materials different from each other. In this embodiment, a method for forming the first and second substrate protective films 11b and 21b, and the first and second main body protective films 13 and 23 is not limited to the ALD, and various known methods such as chemical vapor-deposition may be employed.

Hereinbefore, the embodiment has been described, but an aspect of the invention is not limited to the embodiment.

In the embodiment, a first filter and a second filter may be provided instead of or in addition to the multi-band pass filter 30. That is, a process of providing the first filter and the second filter may be provided. The first filter is provided on the light incident side of the first organic photoelectric conversion element 10, and allows the light L having a wavelength longer than the lower limit of the first wavelength band to be transmitted therethrough. The second filter is provided between the first organic photoelectric conversion element 10 and the second organic photoelectric conversion element 20, and blocks the light L having a wavelength longer than the upper limit of the second wavelength band. According to this, the light L in the first wavelength band and the light L in the second wavelength band can be reliably received by the first and second organic photoelectric conversion elements 10 and 20, respectively.

In the embodiment, a plurality of the first organic photoelectric conversion elements 10 may be arranged to be stacked along the incident direction of the light L. In this case, the organic photoelectric conversion units in the plurality of the first organic photoelectric conversion elements 10 have sensitivity in wavelength bands different from each other. The first wavelength band relating to the sensitivity of the organic photoelectric conversion units in the plurality of the first organic photoelectric conversion elements 10 is different in each case. That is, the embodiment may employ a structure in which three or more organic photoelectric conversion elements receiving light beams in wavelength bands different from each other are stacked. As an example, a structure as illustrated in FIG. 6 may be employed.

FIG. 6 is a schematic cross-sectional view illustrating an organic photoelectric conversion device 200 according to a modification example. The organic photoelectric conversion device 200 includes three transflective organic photoelectric conversion elements (first organic photoelectric conversion elements) 210, 220, and 230 through which light L having a wavelength other than a wavelength of a detection target is transmitted, and a non-transmissive organic photoelectric conversion element (second organic photoelectric conversion element) 240.

The transflective organic photoelectric conversion elements 210, 220, and 230, and the non-transmissive organic photoelectric conversion element 240 are elements which convert the light L into electrical energy. The transflective organic photoelectric conversion elements 210, 220, and 230, and the non-transmissive organic photoelectric conversion element 240 are arranged to be stacked in this order along an incident direction of the light L, and are joined to each other.

The transflective organic photoelectric conversion element 210 includes an element main body (first element main body) 211, and a main body protective film (first protective film) 213 that covers the element main body 211 and is a transparent ALD-formed film. The element main body 211 includes a substrate (first substrate) 211a, a substrate protective film (first substrate protective film) 211b, a transparent electrode (first transparent electrode) 211c, a buffer layer 211d, an organic photoelectric conversion unit 211e, a buffer layer 211f, and a transparent electrode (second transparent electrode) 211g.

The substrate 211a is a transparent film substrate. The substrate protective film 211b covers an outer surface of the substrate 211a and is a transparent ALD-formed film. The transparent electrode 211c is a transparent conductive film, and is provided on a surface of the substrate 211a. The buffer layer 211d is a transparent metal oxide film that adjusts an energy rank between the transparent electrode 211c and the organic photoelectric conversion unit 211e and suppresses a dark current, and is provided on the transparent electrode 211c. The organic photoelectric conversion unit 211e is a photoelectric conversion film including an organic semiconductor, and has sensitivity in the first wavelength band of the light L. In the organic photoelectric conversion unit 211e, a material that has an absorption peak near 340 nm, and has the half value or less of the absorption peak at 464 nm or greater is used. The organic photoelectric conversion unit 211e is provided on the buffer layer 211d. The buffer layer 211f is a transparent metal oxide film that adjusts an energy rank between the organic photoelectric conversion unit 211e and the transparent electrode 211g and suppresses a dark current, and is provided on the organic photoelectric conversion unit 211e. The transparent electrode 211g is a transparent conductive film, and is provided on the buffer layer 211f. The transparent electrode 211g, the buffer layer 211f, the organic photoelectric conversion unit 211e, the buffer layer 211d, and the transparent electrode 211c are stacked on the substrate 211a in this order from the incident side of the light L.

A long-pass filter 201a and a notch filter 201b are provided on the light incident side of the transflective organic photoelectric conversion element 210. The long-pass filter 201a and the notch filter 201b constitute the first filter through which the light L having a wavelength longer than the lower limit of the first wavelength band of the transflective organic photoelectric conversion element 210 is transmitted. The long-pass filter 201a blocks the light L of 344 nm or less, and the notch filter 201b blocks the light L of 345 nm to 464 nm.

The transflective organic photoelectric conversion element 220 is configured in a similar manner as in the transflective organic photoelectric conversion element 210 except that the transflective organic photoelectric conversion element 220 has sensitivity in another first wavelength band different from the first wavelength band relating to the sensitivity of the transflective organic photoelectric conversion element 210. The transflective organic photoelectric conversion element 220 is located on a side opposite to the incident side of the light L with respect to the transflective organic photoelectric conversion element 210. The transflective organic photoelectric conversion element 220 includes an element main body (first element main body) 221, a main body protective film (first protective film) 223 that covers the element main body 221 and is a transparent ALD-formed film. The element main body 221 includes a substrate (first substrate) 221a, a substrate protective film (first substrate protective film) 221b, a transparent electrode (first transparent electrode) 221c, a buffer layer 221d, an organic photoelectric conversion unit 221e, a buffer layer 221f, and a transparent electrode (second transparent electrode) 221g. In the organic photoelectric conversion unit 221e, a material that has an absorption peak near 470 nm, and has the half value or less of the absorption peak at 554 nm or greater is used.

A long-pass filter 202a and a notch filter 202b are provided on the light incident side of the transflective organic photoelectric conversion element 220 and between the transflective organic photoelectric conversion element 210 and the transflective organic photoelectric conversion element 220. The long-pass filter 202a and the notch filter 202b constitute a first filter through which the light L having a wavelength longer than the lower limit of the first wavelength band of the transflective organic photoelectric conversion element 220 is transmitted. The long-pass filter 202a blocks the light L of 464 nm or less, and the notch filter 202b blocks the light L of 475 nm to 554 nm.

The transflective organic photoelectric conversion element 230 is configured in a similar manner as in the transflective organic photoelectric conversion elements 210 and 220 except that the transflective organic photoelectric conversion element 230 has sensitivity in another first wavelength band different from the first wavelength band relating to the sensitivity of the transflective organic photoelectric conversion elements 210 and 220. The transflective organic photoelectric conversion element 230 is located on a side opposite to the incident side of the light L with respect to the transflective organic photoelectric conversion element 220. The transflective organic photoelectric conversion element 230 includes an element main body (first element main body) 231, a main body protective film (first protective film) 233 that covers the element main body 231 and is an ALD-formed film. The element main body 231 includes a substrate (first substrate) 231a, a substrate protective film (first substrate protective film) 231b, a transparent electrode (first transparent electrode) 231c, a buffer layer 231d, an organic photoelectric conversion unit 231e, a buffer layer 231f, and a transparent electrode (second transparent electrode) 231g. In the organic photoelectric conversion unit 231e, a material that has an absorption peak near 560 nm, and has the half value or less of the absorption peak at 644 nm or greater is used.

A long-pass filter 203a and a notch filter 203b are provided on the light incident side of the transflective organic photoelectric conversion element 230 and between the transflective organic photoelectric conversion element 220 and the transflective organic photoelectric conversion element 230. The long-pass filter 203a and the notch filter 203b constitute a first filter through which the light L having a wavelength longer than the lower limit of the first wavelength band of the transflective organic photoelectric conversion element 230 is transmitted. The long-pass filter 203a blocks the light L of 554 nm or less, and the notch filter 203b blocks the light L of 565 nm to 644 nm.

The non-transmissive organic photoelectric conversion element 240 is located on a side opposite to the incident side of the light L with respect to the transflective organic photoelectric conversion element 230. The non-transmissive organic photoelectric conversion element 240 includes an element main body (second element main body) 241, a main body protective film (second protective film) 243 that covers the element main body 241 and is a transparent ALD-formed film. The element main body 241 includes a substrate (second substrate) 241a, a substrate protective film (second substrate protective film) 241b, an electrode 241c, a buffer layer 241d, an organic photoelectric conversion unit 241e, a buffer layer 241f, and a transparent electrode (third transparent electrode) 241g.

The substrate 241a is a transparent film substrate. The substrate protective film 241b is a transparent ALD-formed film that covers the substrate 241a. The electrode 241c is a transparent conductive film, and is provided on a surface of the substrate 211a. The buffer layer 241d is a transparent metal oxide film that adjusts an energy rank between the electrode 241c and the organic photoelectric conversion unit 241e and suppresses a dark current, and is provided on the electrode 241c. The organic photoelectric conversion unit 241e is a photoelectric conversion film including an organic semiconductor, and has sensitivity in the second wavelength band of the light L. In the organic photoelectric conversion unit 241e, a material that has an absorption peak near 650 nm is used. The organic photoelectric conversion unit 241e is provided on the buffer layer 241d. The buffer layer 241f is a transparent metal oxide film that adjusts an energy rank between the organic photoelectric conversion unit 241e and the transparent electrode 241g and suppresses a dark current, and is provided on the organic photoelectric conversion unit 241e. The transparent electrode 241g is a transparent conductive film, and is provided on the buffer layer 241f. The transparent electrode 241g, the buffer layer 241f, the organic photoelectric conversion unit 241e, the buffer layer 241d, and the electrode 241c are stacked on the substrate 241a in this order from the incident side of the light L.

A band pass filter 204 is provided on a light incident side of the non-transmissive organic photoelectric conversion element 240 and between the transflective organic photoelectric conversion element 230 and the non-transmissive organic photoelectric conversion element 240. The band pass filter 204 constitutes a second filter that blocks the light L having a wavelength longer than the upper limit of the second wavelength band. The band pass filter 204 allows the light L of 645 nm to 654 nm to be transmitted therethrough.

In the above-described organic photoelectric conversion device 200, it is possible to carry out narrowing of the detection wavelength range by appropriately overlapping the plurality of filters 201a, 201b, 202a, 202b, 203a, 203b, and 204, and the plurality of organic photoelectric conversion elements 210, 220, 230, and 240, and it is possible to simplify the optical system. It is possible to measure the light L by dividing the light L into four wavelength bands (that is, the three first wavelength bands different from each other, and the second wavelength band).

Note that, in the organic photoelectric conversion device 200, at least any one of the organic photoelectric conversion elements 210, 220, 230, and 240 may include the same laminate film as the first and second laminate films 15 and 25. In the organic photoelectric conversion device 200, the organic photoelectric conversion elements 210, 220, 230, and 240 may be electrically connected to the outside through the main body protective films 213, 223, 233, and 243 as in the organic photoelectric conversion device 100. In the organic photoelectric conversion device 200, a stacking order of the filters 201a and 201b is not limited and is random, a stacking order of the filters 202a and 202b is not limited and is random, and a stacking order of the filters 203a and 203b is not limited and is random.

REFERENCE SIGNS LIST

11: first element main body, 11a: first substrate, 11b: first substrate protective film, 11c: transparent electrode (first transparent electrode), 11d: metal interconnection, 1ie: organic photoelectric conversion unit, 11f: transparent electrode (second transparent electrode), 11g: metal interconnection, 13: first main body protective film (first protective film), 15: first laminate film (third protective film), 21: second element main body, 21a: second substrate, 21b: second substrate protective film, 21c: transparent electrode (third transparent electrode), 21d: metal interconnection, 21e: buffer layer, 21f: organic photoelectric conversion unit, 21g: non-transparent electrode (electrode), 21h: metal interconnection, 23: second main body protective film (second protective film), 25: second laminate film (fourth protective film), 30: multi-band pass filter, 100, 200: organic photoelectric conversion device, 201a: long-pass filter (first filter), 201b: notch filter (first filter), 202a: long-pass filter (first filter), 202b: notch filter (first filter), 203a: long-pass filter (first filter), 203b: notch filter (first filter), 204: band pass filter (second filter), 210, 220, 230: transflective organic photoelectric conversion element (first organic photoelectric conversion element), 211, 221, 231: element main body (first element main body), 213, 223, 233: main body protective film (first protective film), 211a, 221a, 231a: substrate (first substrate), 211b, 221b, 231b: substrate protective film (first substrate protective film), 211c, 221c, 231c: transparent electrode (first transparent electrode), 211e, 221e, 231e: organic photoelectric conversion unit, 211g, 221g, 231g: transparent electrode (second transparent electrode), 240: non-transmissive organic photoelectric conversion element (second organic photoelectric conversion element), 241: element main body (second element main body), 241a: substrate (second substrate), 241b: substrate protective film (second substrate protective film), 241c: electrode, 241e:

organic photoelectric conversion unit, 241g: transparent electrode (third transparent electrode), 243: main body protective film (second protective film), L: light.

The invention claimed is:

1. An organic photoelectric conversion device comprising:
   first and second organic photoelectric conversion elements which convert light into electrical energy,
   wherein the first and second organic photoelectric conversion elements are disposed to be stacked in this order along an incident direction of the light,
   the first organic photoelectric conversion element includes,
   a first element main body including a first substrate, first and second transparent electrodes, and an organic photoelectric conversion unit having sensitivity in a first wavelength band of the light, and
   a first protective film that covers the first element main body, and
   the second organic photoelectric conversion element includes,
   a second element main body including a second substrate, a third transparent electrode, an electrode, and an organic photoelectric conversion unit having sensitivity in a second wavelength band of the light, and
   a second protective film that covers the second element main body,
   wherein the first organic photoelectric conversion element includes a third protective film that covers an outer surface of the first protective film,
   wherein the second organic photoelectric conversion element includes a fourth protective film that covers an outer surface of the second protective film,
   wherein the third protective film does not cover a part of the outer surface of the first protective film on a metal interconnection that is electrically connected to the first and second transparent electrodes, and
   wherein the fourth protective film does not cover a part of the outer surface of the second protective film on a metal interconnection that is electrically connected to the third transparent electrode and the electrode.

2. The organic photoelectric conversion device according to claim 1, wherein the first wavelength band is a wavelength band that is shorter than the second wavelength band.

3. The organic photoelectric conversion device according to claim 1, further comprising:
   a multi-band pass filter which is provided on a light incident side of the first organic photoelectric conversion element, and through which the light in the first wavelength band and the light in the second wavelength band are transmitted.

4. The organic photoelectric conversion device according to claim 1, further comprising:
   a first filter which is provided on the light incident side of the first organic photoelectric conversion element and through which the light having a wavelength longer than a lower limit of the first wavelength band is transmitted; and
   a second filter which is provided between the first organic photoelectric conversion element and the second organic photoelectric conversion element, and blocks the light having a wavelength longer than an upper limit of the second wavelength band.

5. The organic photoelectric conversion device according to claim 1, wherein the first and second protective films are inorganic films, organic films, or stacked films of an inorganic film and an organic film.

6. The organic photoelectric conversion device according to claim 5, wherein the first and second protective films include at least one of alumina, titanium oxide, and polyparaxylylene.

7. The organic photoelectric conversion device according to claim 1,
   wherein the first organic photoelectric conversion element includes a first substrate protective film that covers the first substrate, and
   the second organic photoelectric conversion element includes a second substrate protective film that covers the second substrate.

8. The organic photoelectric conversion device according to claim 1,
   wherein the first and second transparent electrodes are electrically connected to an outer side through the first protective film, and
   the third transparent electrode and the electrode are electrically connected to the outside through the second protective film.

* * * * *